United States Patent [19]

Imai et al.

[11] Patent Number: 4,839,649

[45] Date of Patent: Jun. 13, 1989

[54] SIGNAL PROCESSING SYSTEM

[75] Inventors: Hideki Imai; Minoru Sasaki, both of Yokohama, Japan

[73] Assignee: Kabushiki Kaisya Advance Kaihatsu Kenkyujo, Tokyo, Japan

[21] Appl. No.: 71,573

[22] Filed: Jul. 9, 1987

Related U.S. Application Data

[63] Continuation of Ser. No. 820,746, Jan. 22, 1986, abandoned.

[30] Foreign Application Priority Data

May 22, 1984 [JP]  Japan .................. 59-101777

[51] Int. Cl.⁴ ............................................. H03M 7/40
[52] U.S. Cl. .......................................... 341/65; 341/51; 341/77; 375/28; 332/11 D
[58] Field of Search ................ 370/110.4, 111; 375/28; 340/347 AD, 347 M; 332/11 D; 341/50, 51, 59, 60, 64, 65, 76, 77, 126, 143, 144, 155

[56] References Cited

U.S. PATENT DOCUMENTS

| | | | |
|---|---|---|---|
| 4,121,259 | 10/1978 | Preuss et al. | 340/347 DD X |
| 4,201,958 | 5/1980 | Ahamed | 375/28 X |
| 4,287,595 | 9/1981 | Meyers | 375/28 |
| 4,542,516 | 9/1985 | Weirich | 375/30 |

*Primary Examiner*—William M. Shoop, Jr.
*Assistant Examiner*—Brian Young
*Attorney, Agent, or Firm*—Finnegan, Henderson, Farabow, Garrett and Dunner

[57] ABSTRACT

A signal processing system capable of converting various input analog signals including bioelectric signals, such as electrocardiographic signals, electro-encephlographic signals, and pulse wave signals, into digital signals by A/D converter, compressing the converted data by data compression, recording the compressed data on a compressed data recorder, regenerating the compressed data fetched from the compressed data recorder by data regeneration including a Huffman decoder, mode selector and regenerated data forming device, and then providing analog signals corresponding to the regenerated data.

7 Claims, 13 Drawing Sheets

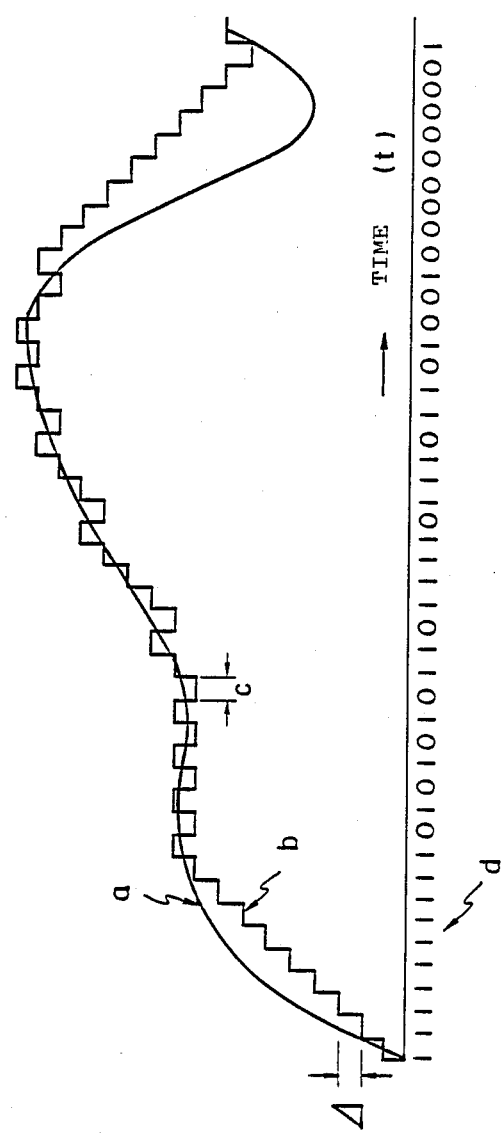

Fig.5a ORIGINAL WAVEFORM
Fig.5b AZTEC REGENERATED WAVEFORM
Fig.5c REGENERATED WAVEFORM BY THE PRESENT INVENTION.

SIGNAL PROCESSING SYSTEM

DESCRIPTION

1. Technical Field

The present invention relates to a novel signal processing system for compressing and expanding various analog input signals including bioelectric signals such as electrocardiographic signals, electroencephalographic signals, and pulse wave signals.

2. Background Art

Recently, there has been proposed a new diagnostic system utilizing data obtained by recording the results of a real time analysis of bioelectric signals, such as electrocardiographic signals, electroencephalographic signals, and pulse wave signals. However, an extended operation for converting bioelectric analog signals into the corresponding digital signals and recording the data requires an enormous storage capacity, and in most cases, it is difficult to provide a portable recording apparatus for extended recording having a sufficient storage capacity.

Accordingly, the development of a novel system capable of sufficiently recording all of the information represented by bioelectric analog signals by using a memory having a small storage capacity, and capable of regenerating all of the information represented by the bioelectric analog signals is desired.

SUMMARY OF THE INVENTION

Accordingly, it is an object of the present invention to provide a novel signal processing system developed to meet the above-mentioned need.

The present invention deals with signal waves produced through linear quantization. When a signal wave has a quantized voltage V(t) at a time t, the digitized signal wave is represented by:

$$V(t) (t=1, 2, \ldots, \lambda)$$

where $\lambda$ is the number of samples.

When quantization is performed with n bits, the data is represented by n·$\lambda$ bits. In the present invention, the term "data compression" means recording or transmitting a signal wave represented by n·$\lambda$ bits in a lesser number of bits, and the term "decoding" means regenerating the signal wave from the compressed data.

The present invention is based on delta modulation (abbreviated to ¢$\Delta$M" hereinafter) and is a development of adaptive $\Delta$M (abbreviated to "ADM" hereinafter) technology in which the position of a predicted point and the width of the quantization step are varied adaptively according to the characteristics of an optional analog signal such as a bioelectric signal. The signal processing system of the present invention comprises A/D conversion means for converting input signals into the corresponding digital signals, and data compressing means for compressing the digital output data of the A/D conversion means. The data compressing means comprises delta modulation processing means for converting a digital signal into a sample point in one of a plurality of delta modulation modes in which the position of a predicted point and the width of the quantizing step are variable, mode selecting means for adaptively selecting one mode among a plurality of the delta modulation modes, and coding means for processing the sample point through the Huffman coding process.

BRIEF DESCRIPTION OF THE DRAWINGS

FIGS. 1 to 4 are diagrammatic illustrations explaining the ADM process carried out by the signal processing system of the present invention;

FIGS. 5a, 5b and 5c are diagrams of assistance in illustrating the functions and effects of a signal processing system, in a preferred embodiment, according to the present invention;

DETAILED DESCRIPTION OF PREFERRED EMBODIMENT

First the ADM process will be described briefly.

(1) $\Delta$M $\Delta$M is the most simple mode of differential pulse code modulation. The differential pulse code modulation is a physical mode for quantizing the difference between a sampled value at the present time and the sampled value at a previous time, which requires coding bits which are fewer in number than the bits required for quantizing each of the sampled values.

$\Delta$M simplifies the quantization and expresses whether the present sampled value is "greater" or "smaller" than the preceding sampled value by one bit. As illustrated in FIG. 1 (a: signal waveform, b: transmission waveform, c: sampling interval, d: transmission bit string, t: time), since $\Delta$M encodes the difference by one bit, the coding algorithm is simple. However, since only one quantizing step can be changed in one sample interval, $\Delta$M is unable to follow the signal waveform when the inclination of the signal waveform is 1 or greater, or $-1$ or less.

Figure 2A:
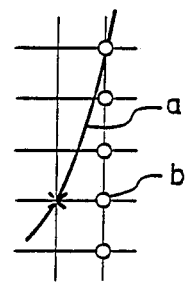
Figure 2B:
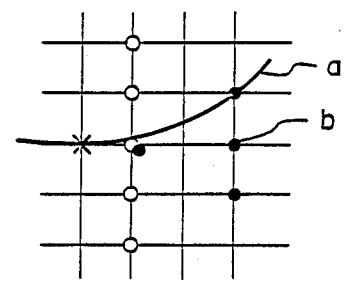

(2) ADM $\Delta$M is regarded as a predictive coding system which predicts values which are greater than and smaller than the preceding expanded value, respectively, by $\Delta$, and selects a value having a smaller error from the present sampled value. Fundamentally, ADM is equivalent to $\Delta$M. The method of setting prediction points is designated as the prediction point mode. An example of the prediction point mode will be described hereinafter. As illustrated in FIG. 2a (a: signal waveform, b: prediction point), in a section where the inclination of the signal waveform is sharp, increasing prediction points in the direction of voltage facilitates tracking of great variations of the signal waveform. On the other hand, as illustrated in FIG. 2b (a: signal waveform, b: prediction point), in a section where the inclination of the signal waveform is moderate, setting prediction points as indicated by "—O—" is inefficient. Therefore, prediction points are set as indicated by "—●—", and the value between the values at the adjacent prediction points may be estimated, without any significant error, by interpolation using those values of the adjacent prediction points. However, an increase in the number of prediction points has an adverse affect on the compression ratio. Nevertheless, as illustrated in FIG. 2b, since the interpolated value estimated during regeneration is not included in the compressed data, it is possible to improve the compression ratio of ADM generally as compared with $\Delta$M. In the drawings, a symbol "X" indicates the present point.

(3) Setting and Transition of Prediction Point Mode Features of Digitized Signal Suppose that an electrocardiogram to be subjected to data compression is sampled at a sampling frequency of 500 Hz, is quantized by linear quantization with eight bits, and the quantization step is approximately 2 $\mu V$. Voltage is represented by quantization steps hereinafter.

In order to estimate the condition of predicted values, the absolute values of the differences between three successive sampled values were examined (Table 1). The data used herein are electrocardiograms of a perfectly normal individual and the output of an electrocardiographic simulator.

As apparent from Table 1, the ratio of the abrupt great change in the difference between two adjacent sampled values is small, and the ratio of change as great as two or above, is 3% or below. That is, when the inclination of the waveform in a certain section is N, the probability of the inclination of the waveform in the following section becoming N−1, N, or N+1, is high.

TABLE 1

| | | | | | Unit: % S2 | | | | |
|---|---|---|---|---|---|---|---|---|---|
| $\Sigma\omega$ | 0 | 1 | 2 | 3 | 4 | 5 | 6 | 7 | 8 | 9~ |
| 0 | 49.87 | 16.13 | 0.17 | 0.01 | 0.01 | 0.02 | | | | |
| 1 | 16.10 | 6.57 | 1.25 | 0.21 | 0.02 | 0.02 | 0.02 | 0.01 | | |
| 2 | 0.21 | 1.26 | 1.05 | 0.51 | 0.12 | 0.08 | 0.01 | 0.01 | | |
| 3 | 0.01 | 0.22 | 0.58 | 0.68 | 0.34 | 0.08 | 0.05 | 0.01 | | |
| 4 | 0.02 | 0.02 | 0.09 | 0.30 | 0.48 | 0.27 | 0.08 | 0.04 | 0.01 | |
| 5 | | | 0.08 | 0.18 | 9,27 | 9,23 | 9,19 | 9.97 | 9,91 | 0.02 |
| 6 | | 0.01 | 0.02 | 0.03 | 0.02 | 0.12 | 0.10 | 0.13 | 0.07 | 0.02 |
| 7 | | | | 0.02 | 0.05 | 0.14 | 0.06 | 0.16 | 0.09 | 0.09 |
| 8 | | | | | | | 0.07 | 0.08 | 0.10 | 0.14 |
| 9~ | | | | 0.03 | | | 0.04 | 0.07 | 0.12 | 0.38 |

S1 = |V(t) − V(t − 1)|, S2 = |v(t + 1) − v(t)|
Note: Values for blanks are zero.

Accordingly, the algorithm is constituted according to the following.

(i) In the section where the slope is moderate, several prediction points are set ahead on the time axis only for positions where the inclination is within ±2. Since the probability of inclinations greater than ±2 is small, compression along the time axis will not be effective.

(ii) In many sections, the inclination is zero, namely, the voltage is constant, and such sections often appear in succession. Accordingly, when a section is regarded as a section whereat the voltage is constant, prediction points are arranged along the time axis at the same voltage levels as the present point.

(iii) In a section where the inclination is sharp, compression along the time axis is not performed. Several prediction points are arranged along the voltage axis at the same time point so that the variation of the waveform can be followed.

(iv) The information relating to the prediction point mode is not encoded. The next mode is decided according to the selected prediction point.

(v) The Huffman coding is applied to encoding the prediction points in order to minimize the average code length.

Examples of Mode and Mode Transition

Figure 3A:
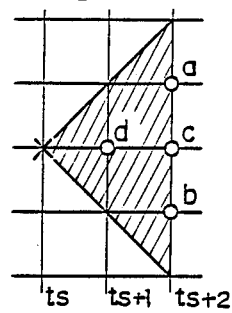
Figure 3B:
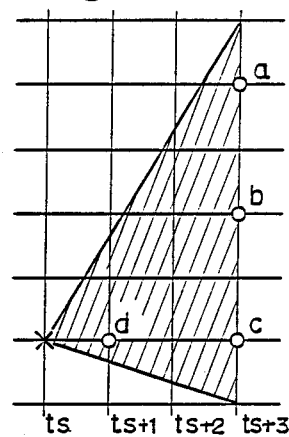
Figure 3C:
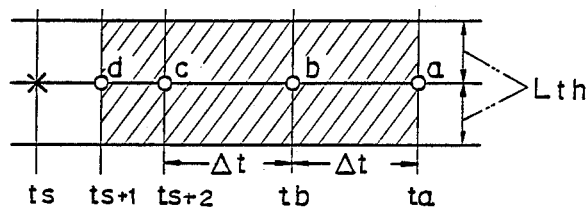
Figure 3D:
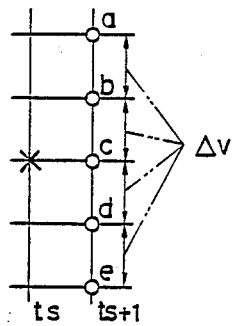
Figure 3E:
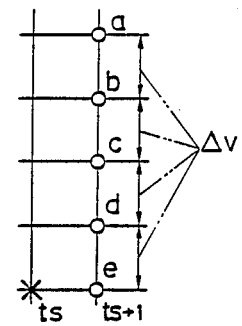
Figure 4:
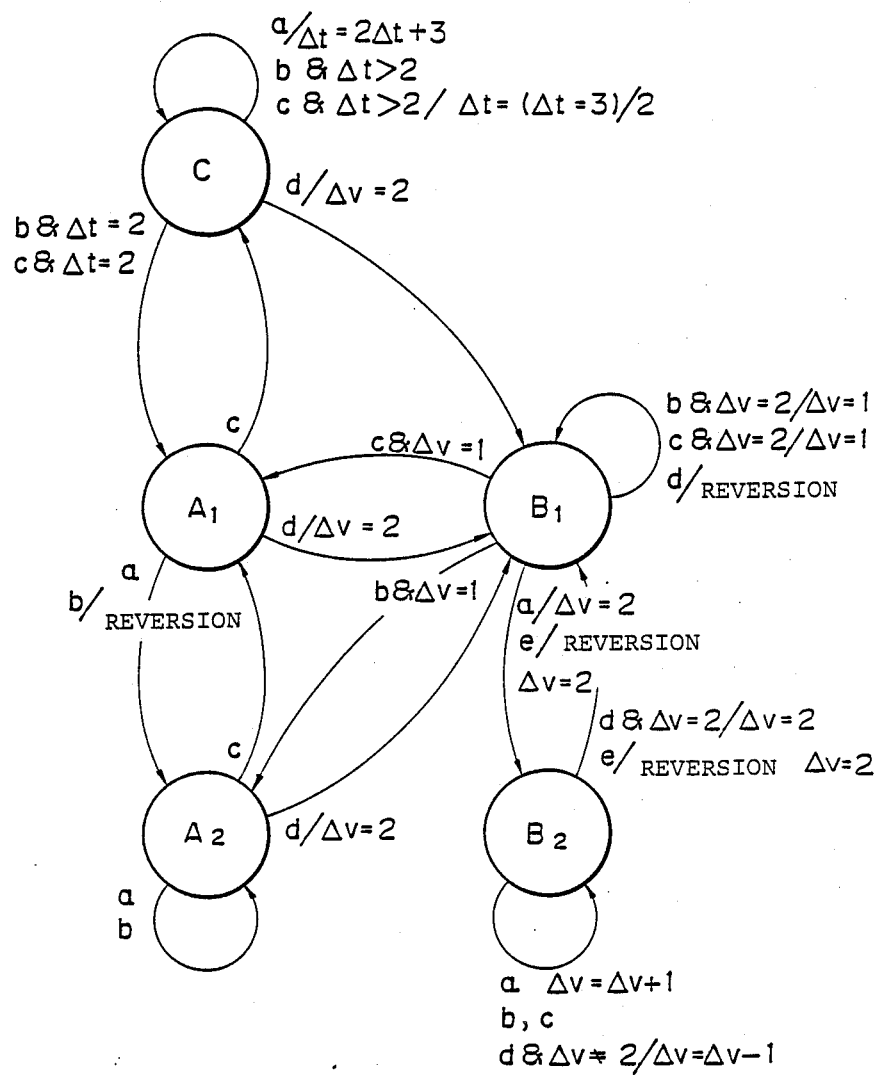

FIGS. 3a to 3e illustrate five examples of the pattern (designated as "mode" hereinafter) of the prediction point mode, and FIG. 4 illustrates an example of mode transition. In FIGS. 3a to 3e, a time indicated by ts corresponds to the time coordinate of a data which has corresponds to a preceding sample point. FIGS. 3a to 3e illustrate states wherein the polarity is positive. When the polarity is negative, FIGS. 3a to 3e are inverted top-to-bottom.

(i) Mode of compression along the time axis

Mode A1 (FIG. 3a)

Figure 8:
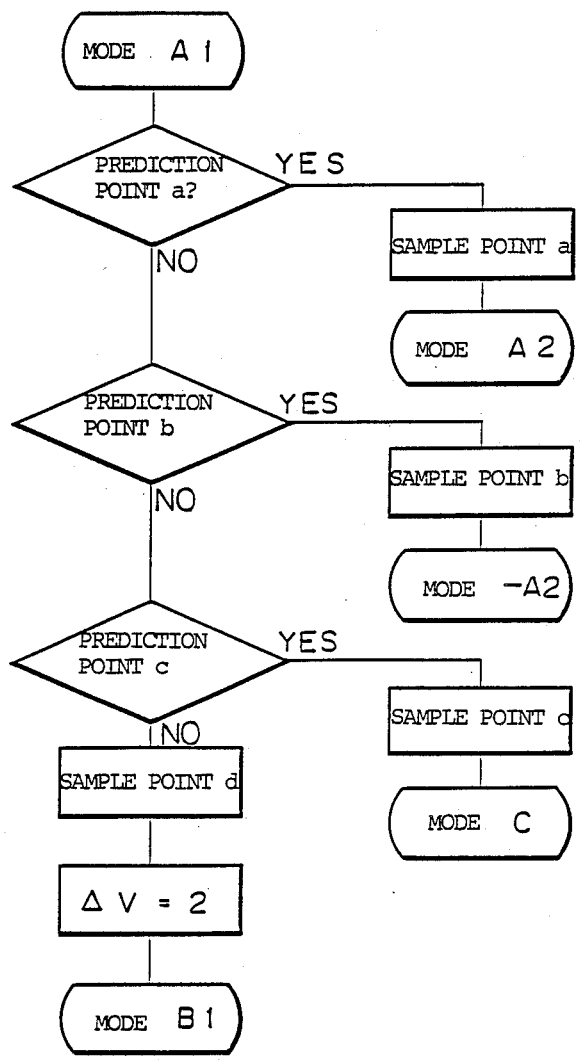

The mode A1 is employed when the inclination is moderate. When a data at a time ts+2 is within the shaded range, either prediction points a, b, c or as shown in FIG. 3a are set, and the mode is changed to either A2, -A2, or c respectively as shown in FIG. 8. range, a prediction point d is set (FIG. 3a) and the mode is changed to mode B1 a mode for a state wherein the inclination is sharp.

Mode A2 (FIG. 3b)

Figure 9:
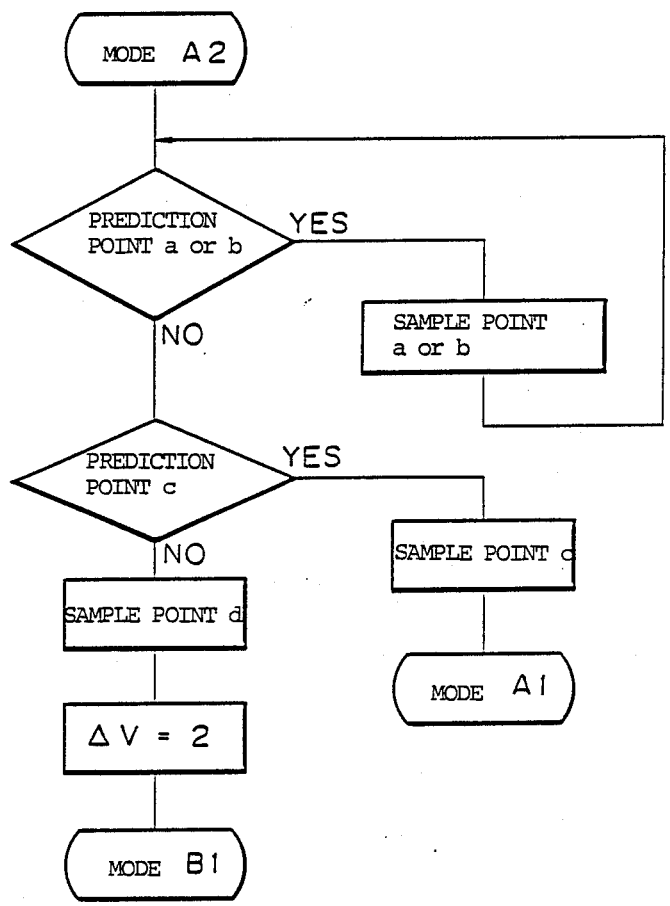
Figure 10:
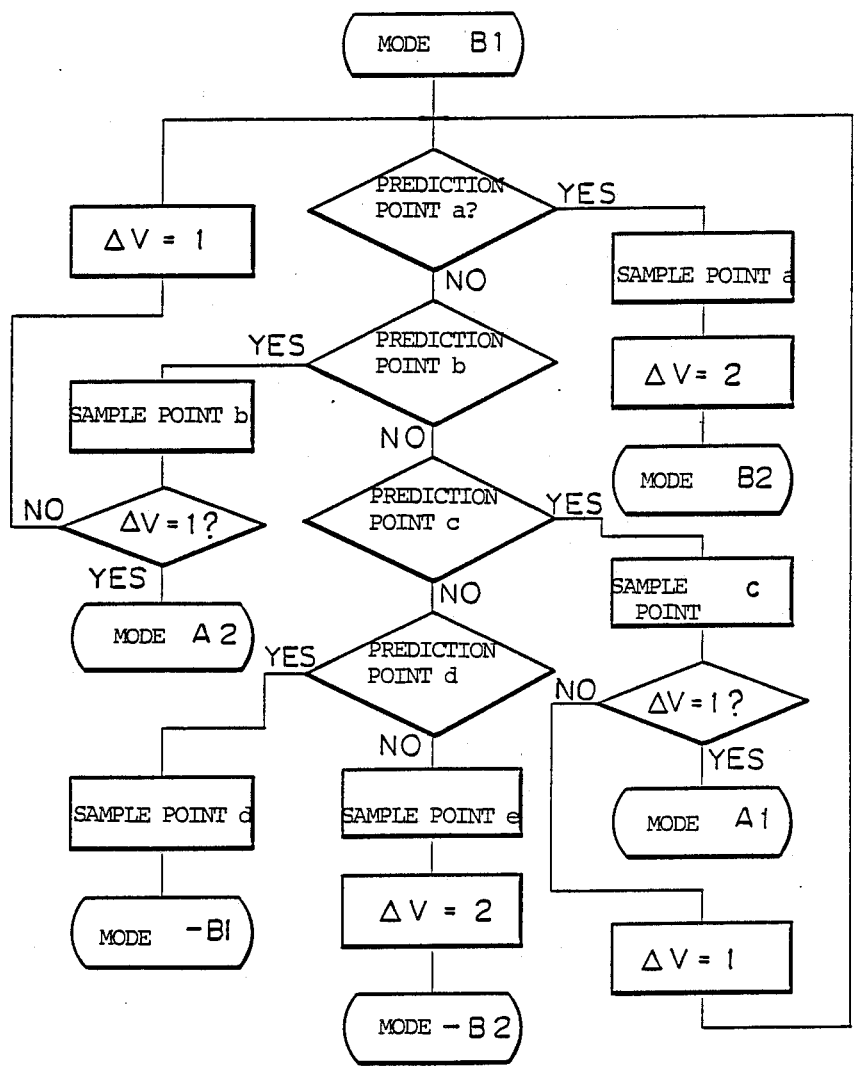
Figure 11:
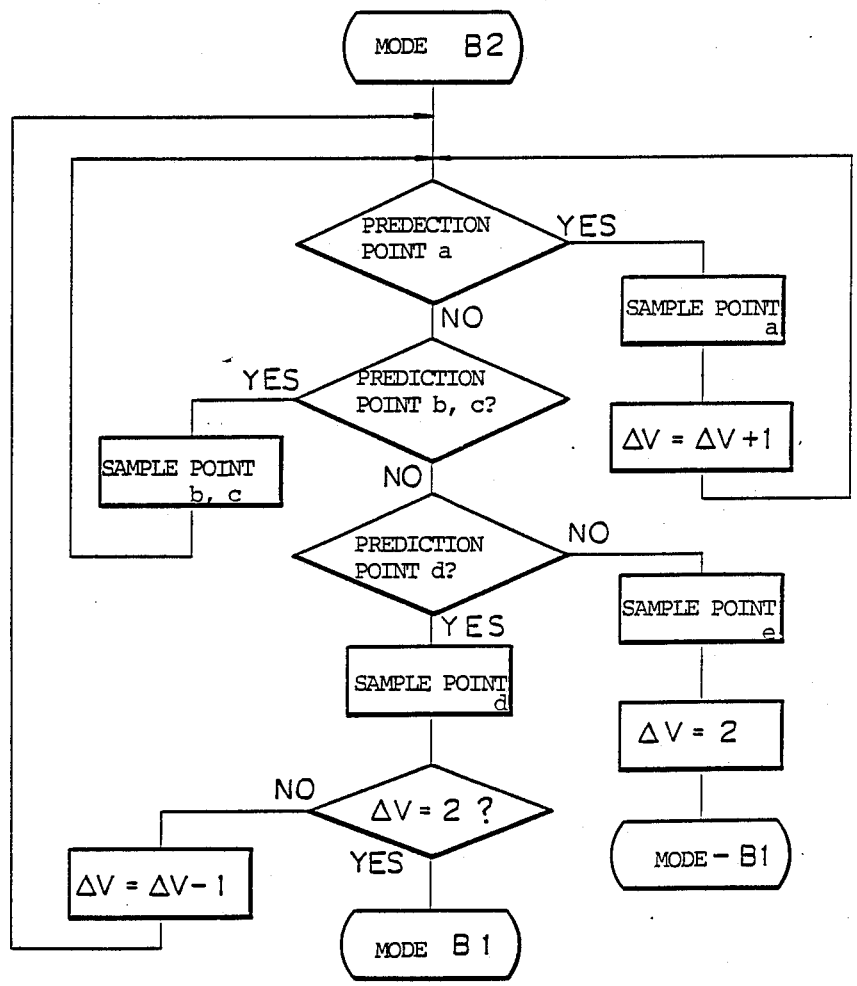
Figure 12:
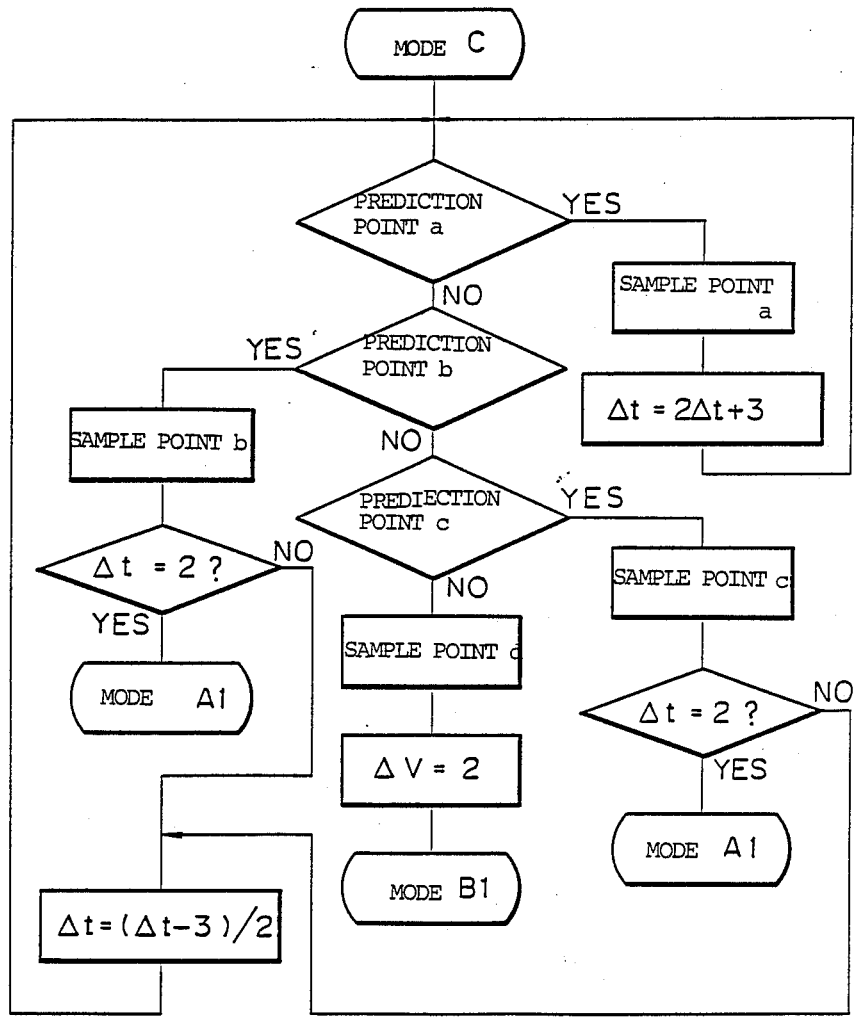

This mode is employed when the inclination is moderate and the polarity of the original waveform is expected to be definite. When the data at a time ts+3 is within the shaded range, prediction points a, b, and c as shown in FIG. 3b are set, and the mode remains at A2 or changes to A1 as shown in FIG. 9 and, when not, a prediction point d is set and the mode is changed to mode B1 a mode for a state wherein the inclination is sharp.

Mode c (FIG. 3c)

This mode is employed when the voltage is expected to be constant. Lth and $\Delta t$ are predetermined and the minimum tn meeting the following expression within a period from the time ts+1 to a time ta is found out.

$$|V(th) - V(ts)| > Ltn$$

When tn cannot be found, a prediction point a is set retaining mode. When tb < tn ≦ ta and ts +2 < tn < tb, the prediction points are b and c, respectively changing the mode to A1. When tn ≦ ts+2, the prediction point is d and the mode is changed to a mode B1 for a state wherein the inclination is sharp.

(ii) Mode corresponding to abrupt variation

Mode B1 (FIG. 3d)

This mode is selected when the inclination is sharp and the polarity is expected to be indefinite. This mode is effective for preserving the peaks and inflection points of the waveform.

Mode B2 (FIG. 3e)

This mode is selected when the inclination is sharp and the polarity is expected to be definite.

FIG. 4 shows a concrete example of the above-mentioned mode transition. In FIG. 4, characters above the slash marks indicate the types of prediction points (a, b, c, d, and e), and the steps ($\Delta V$) and the time intervals ($\Delta t$) of the same, and the characters below the slash marks indicate processes for setting the step and time interval of quantization and the inversion of the polarity.

(4) Huffman Coding

A code which produces the shortest code length when coding each information source symbol into a uniquely composable code with respect to a given information source, is referred to as a compact code. A method of constituting the compact code is proposed by Huffman, and hence such a code is designated as a Huffman code. A method of constituting a Huffman code will be described hereinafter.

(a) A leaf corresponding to each information source symbol is prepared. The probability of occurrence of the information source symbol is entered on each leaf.

(b) One node is prepared for two leaves having the least probability and the node is connected to the leaves by branches. 0 and 1 is assigned to one of the two leaves and to the other, respectively. The sum of the probabilities of these two leaves is entered on the node to regard this node as a new leaf, that is, the branches extending from the node are considered to be removed.

(c) When only one leaf is left, the code constituting process is completed and, when not, the process returns to (b).

The data tabulated in Table 1 was subjected to the Huffman coding process to obtain a code length (bit). The results are summarized in Table 2.

TABLE 2

| Mode | Prediction point | | | | |
|------|---|---|---|---|---|
|  | a | b | c | d | e |
| A1 | 1 | 3 | 2 | 3 | — |
| A2 | 3 | 2 | 1 | 3 | — |
| B1 | 2 | 2 | 2 | 3 | 3 |
| B2 | 3 | 2 | 2 | 2 | 3 |
| C  | 1 | 3 | 2 | 2 | — |

(5) Data Decoding

The sample point of the compressed data is decoded by processing the compressed data through the Huffman decoding process, and the processing through the mode transition process (mode selection process). The signal waveform can be regenerated satisfactorily, for example, simply by the linear interpolation of the value between the values of the regenerated data on the basis of the sample point.

It was found through comparative examination of the system of the present invention and the AZTEC system in respect of compression ratio and approximate error on the basis of the above-mentioned description that the present invention has various effects. For the comparison of compression ratio, the following coding was performed. First, quantization steps ΔV(ti) for sample points V(ti) were obtained by:

$$\Delta V(t_i) = V(t_i) - V(t_{i-1})$$

Then, the quantization steps were coded by the code lengths shown in Table 3 and the compression ratio η was obtained by η=Baft/Bpre, where Bpre is the total number of bits of the data of the original waveform and Baft is the total number of bits of the compressed data.

TABLE 3

| | Code length (bit) |
|---|---|
| Δti | |
| 1~15 | 4 |
| 16~30 | 8 |
| 31~45 | 12 |
| 46~299 | 20 |
| 300~ | 20 |
| ΔV(ti) | |
| −150~−23 | 12 |
| −22~−7 | 8 |
| −6~6 | 4 |

TABLE 3-continued

| | Code length (bit) |
|---|---|
| 7~22 | 8 |
| 23~150 | 12 |

The approximate error of the regenerated waveform was determined by the RMSE (Root Mean Square Error) method expressed by:

$$RMSE = \sqrt{\sum_{t=1}^{l} (V'(t) - V(t))^2 / l}$$

where V(t) is the original waveform, V'(t) is the regenerated waveform, and λ is the number of samples.

It was found that the system of the present invention and the AZTEC system are similar in respect of the compression ratio and their compression ratios were about 10%, whereas there was a great difference between the system of the present invention and the AZTEC system in the approximate errors; the approximate errors were 1.0 or less for the system of the present invention and 1.5 to 4.3 for the AZTEC system.

FIGS. 5a, 5b and 5c illustrate the original waveform (a), the waveform regenerated by the AZTEC system, and the waveform (c) regenerated by the system of the present invention, respectively. It is apparent that the waveform regenerated by the system of the present invention represents the features of the original waveform very accurately.

In view of application to extended electrocardiographic recording, the time required for coding according to the coding system of the present invention was measured. A program written by FORTRAN 80 was executed on Z80 of 6 MHz clock frequency. Results showed that the average time required for coding one sample point was 0.84 msec. Possible coding time per one sample point for the realtime compression of an electrocardiogram obtained at a sampling frequency of 500 Hz is 2 msec or less. Accordingly, the coding system of the present invention meets the requisite condition for realtime compression.

(6) Embodiment of the Invention

Figure 6A:
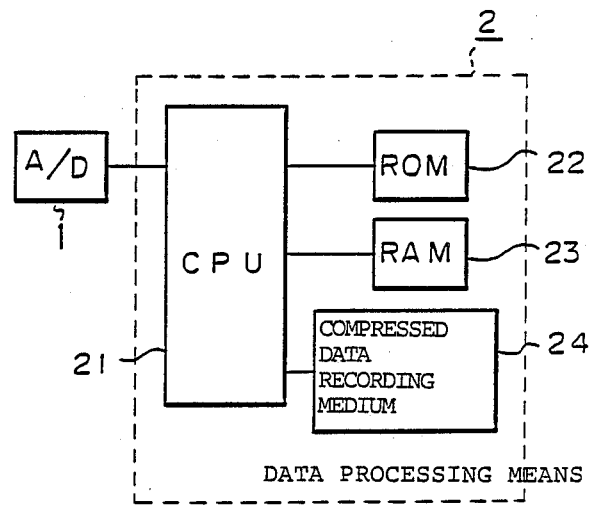
FIGS. 6a and 6b are block diagrams of the signal processing system.

FIG. 6a is a block diagram of a data compression system, in a preferred embodiment, according to the present invention. The data compression system comprises A/D conversion means 1 for converting input analog signals into digital signals and data processing means 2 comprising a central processing unit (CPU) 21, a read-only memory (ROM) 22, a random access memory (RAM) 23 and a compressed data recording medium 24. The CPU 21 reads an instruction program stored in the ROM 23 to execute data processing. The CPU 21 receives input digital signals given thereto by the A/D conversion means 1 and stores the input digital signals temporarily in the RAM 23. Then, the CPU 21 processes the input digital data through ADM in accordance with the algorithm of ADM, compresses the original signal waveform by Huffman-coding the sample values obtained by the ADM process, and then records the compressed data in the compressed data recording medium 24.

The algorithm of the ADM process will be described more specifically hereinafter with reference to FIGS. 7 to 12.

Figure 7:
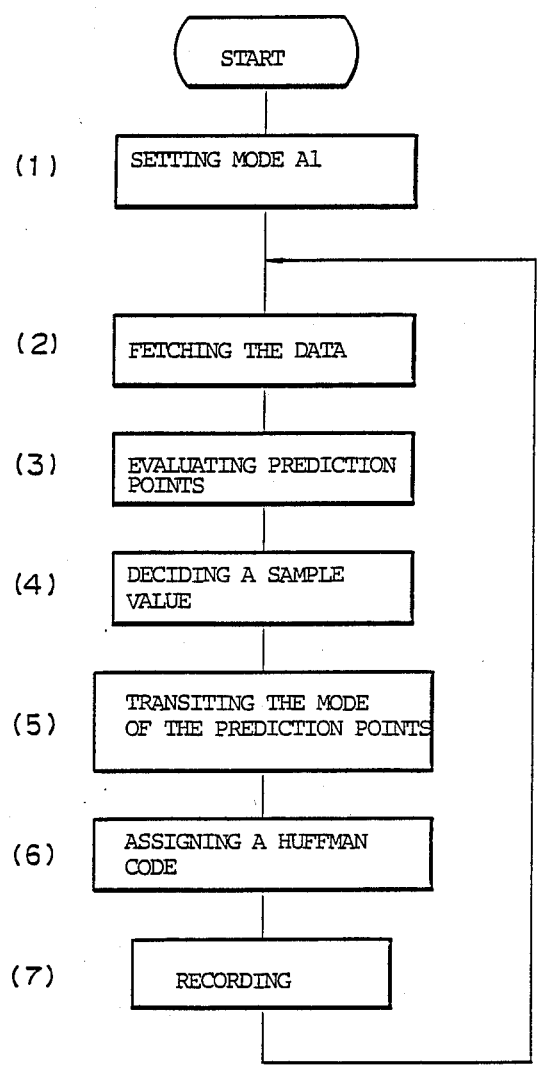
FIGS. 7 to 13 are flow charts of algorithm of the data compressing and expanding processes.

FIG. 7 is a general flow chart of the algorithm of the ADM process. This algorithm is a routine comprising Step 1 for setting the mode of prediction points for the first data at Mode $A_1$, Step 2 for fetching the data stored temporarily in the RAM 23, Step 3 for evaluating the prediction points according to the mode of the same, Step 4 for deciding a sample value, Step 5 for transiting the mode of the prediction points (mode selection), Step 6 for assigning a Huffman code to the sample data, and Step 7 for recording the coded data on the compressed data recording medium 24. Upon the completion of Step 7, the routine returns to Step 2 for data input.

FIGS. 8 to 12 are algorithms of the ADM process for the modes $A_1$, $A_2$, $B_1$, $B_2$, and C, each corresponding to Steps 3 to 5, respectively. In FIG. 8 (Mode $A_1$), for instance, a decision is made whether or not the input data is applicable to the prediction point a of the corresponding mode. If so, the prediction point a is decided as a sample point a and changes the mode to Mode $A_2$. If not, the routine advances to a step for deciding whether or not input data is applicable to the prediction point b of the corresponding mode. Thus, the following steps are executed sequentially.

The processes for other modes shown in FIGS. 9 to 12 are substantially the same as the process of FIG. 8.

In FIGS. 8 to 12, the quantization step width is represented by $\Delta V$, and Step "$\Delta V=2$" is a step to set the quantization step width at 2, Step "$\Delta V=1$?" is a step to decide whether or not the quantization step width is 1, and Step "$\Delta V=\Delta V\pm 1$" is a step to increase or decrease the quantization step width by 1, which are the same for time interval $\Delta t$.

Figure 6B:
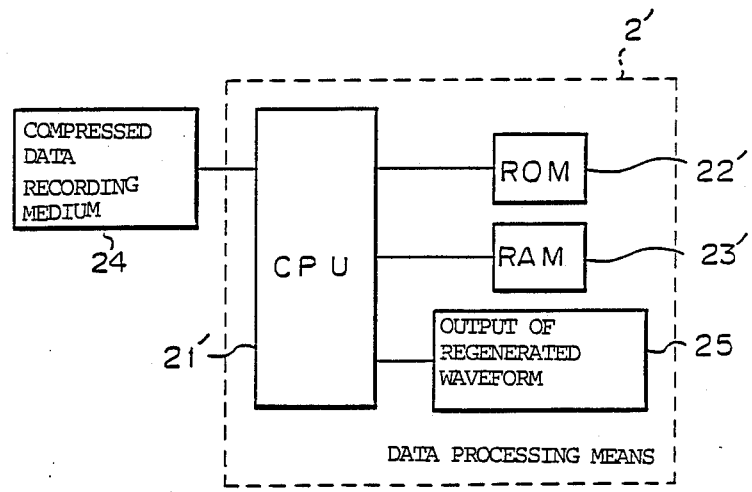

FIG. 6b is a block diagram of a data regenerating system, in a preferred embodiment according to the present invention. The system comprises a compressed data recording medium 24 and data processing means 2' including a CPU 21', a ROM 22', a RAM 23', and a regenerated waveform output unit 25.

Figure 13:
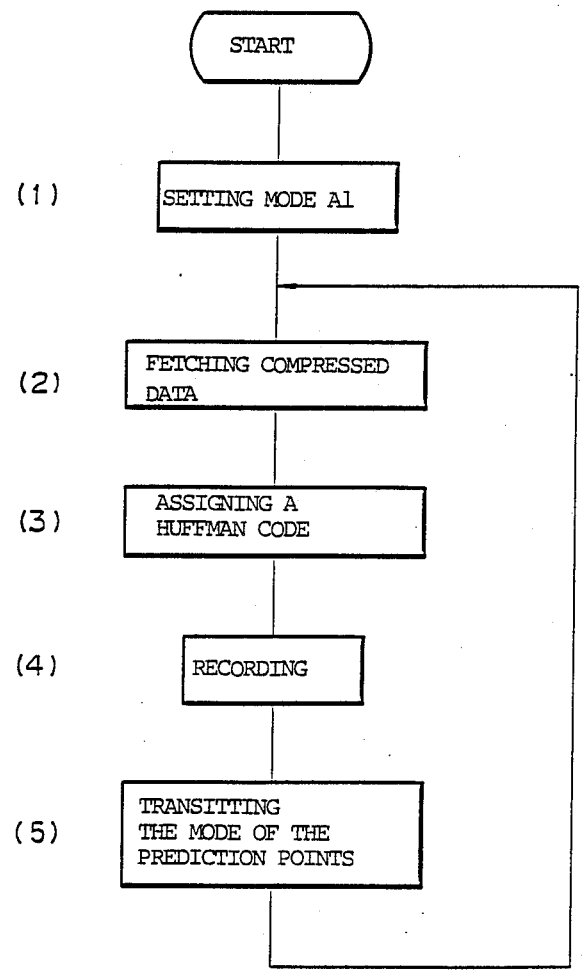

FIG. 13 shows a general regeneration algorithm which is executed by the data processing means 2'.

The routine of the regeneration algorithm comprises Step 1 for setting the mode of prediction points for the first compressed data at the Mode A, Step 2 for fetching the compressed data stored temporarily in the RAM 23', Step 3 for decoding the Huffman code, Step 4 for recording the decoded data, and Step 5 for transiting the mode of the prediction point. After Step 5, the routine returns to Step 2.

The details of the algorithm for each mode of Step 5, namely, the mode transition step, are equivalent to those of FIGS. 8 to 12, except that the step for deciding the sample point is omitted. However, the Huffman-coded data corresponding to the compressed data will be given to the step for deciding the prediction point, therefore, the decision is made on the basis of the Huffman code at the prediction point decision step.

Part of the results of the execution of the embodiment was described hereinbefore.

As apparent from the foregoing description, the system of the present invention is very useful as means for compressing and regenerating optional analog signal waveforms, and hence the system is an effective means universally applicable not only to bioelectric signal processing, such as processing electrocardiographic signals, but also to various data communication systems.

We claim:

1. A method of processing analog signals, comprising the steps of:

converting the analog input signals into digital data; and receiving the converted digital data at periodic sampling intervals;

compressing the received converted digital data values, said step of compressing including the substeps of:

storing a plurality of delta modulation modes, each mode including a plurality of predetermined prediction values;

comparing each received detected data value with the predetermined prediction values of a selected mode;

determining the sample point value of each compared digital data value in accordance with a selected one of the plurality of prediction values of the selected mode; and selecting one of the plurality of modes for comparing the presently received data in accordance with the selected one of the prediction value of previously received data.

2. A signal processing system according to claim 1, when in said input signal is an electrocardiographic signal.

3. The method of claim 5, wherein the substep of comparing includes selecting a comparison time subsequent to each preceding sample point value in accordance with the selected mode for the preceding sample point data value.

4. The method of claim 1, wherein the step of compressing further includes the substep of selecting the mode in accordance with the step width value between each of the plurality of prediction values of the previously selected mode.

5. The method of claim 5, further comprising the steps of:

encoding each of the sample point values with a Huffman code; and recording the coded data values.

6. A method of processing analog signals, comprising the steps of:

converting the analog input signals into digital data; and receiving the converted digital data at periodic sampling intervals;

compressing the received converted digital data value, said step of compressing including the substeps of, storing a plurality of delta modulation modes, each mode including a plurality of predetermined prediction values, comparing each received detected data value with the predetermined prediction value of a selected mode, determining the sample point value of each compared digital data value in accordance with a selected one of the plurality of prediction values of the selected mode, selecting one of the plurality of modes for comparing the presently received data in accordance with the selected one of the prediction values of previously received data, encoding each of the sampled data values with a Huffman code, and recording the Huffman coded data values; and
regenerating the recorded digital data, said step of regenerating including the substeps of, decoding the recorded Huffman coded data values in sequence, selecting one of the plurality of delta modulation modes in accordance with each respective decoded data value, and linearly interpolating the decoded data values between each of the decoded sample point data values.

7. A signal processing system according to claim 6, where n said input signal is an electrocardiographic signal.

* * * * *

UNITED STATES PATENT AND TRADEMARK OFFICE
CERTIFICATE OF CORRECTION

PATENT NO. : 4,839,649

DATED : June 13, 1989

INVENTOR(S) : HIDEKI IMAI ET AL.

It is certified that error appears in the above-identified patent and that said Letters Patent is hereby corrected as shown below:

Claim 3, column 8, line 25, "Claim 5" should be
--Claim 1--.

Claim 5, column 8, line 35, "Claim 5" should be
--Claim 1--.

Signed and Sealed this

Twelfth Day of March, 1991

Attest:

HARRY F. MANBECK, JR.

Attesting Officer

Commissioner of Patents and Trademarks